United States Patent
Igeta et al.

(10) Patent No.: US 7,106,108 B2
(45) Date of Patent: Sep. 12, 2006

(54) SEMICONDUCTOR INTEGRATED CIRCUIT AND EVALUATION METHOD OF WIRING IN THE SAME

(75) Inventors: Mitsuaki Igeta, Kawasaki (JP); Shigetoshi Wakayama, Kawasaki (JP); Seiji Endou, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 41 days.

(21) Appl. No.: 10/869,860

(22) Filed: Jun. 18, 2004

(65) Prior Publication Data

US 2005/0144546 A1   Jun. 30, 2005

(30) Foreign Application Priority Data

Dec. 24, 2003   (JP) ............................. 2003-427603

(51) Int. Cl.
*G01R 31/08* (2006.01)
*G06F 11/00* (2006.01)

(52) U.S. Cl. ...................... 327/100; 714/735

(58) Field of Classification Search ............... 324/500, 324/512, 537; 327/100; 714/37, 735
See application file for complete search history.

(56) References Cited

U.S. PATENT DOCUMENTS

| | | | | |
|---|---|---|---|---|
| 4,689,551 A | * | 8/1987 | Ryan et al. ................ 324/539 |
| 5,162,259 A | * | 11/1992 | Kolar et al. ................ 438/642 |
| 5,621,740 A | * | 4/1997 | Kamada ..................... 714/727 |
| 6,028,431 A | * | 2/2000 | Hashida ...................... 324/537 |
| 6,865,703 B1 | * | 3/2005 | Shimomura et al. ........ 714/726 |
| 6,954,083 B1 | * | 10/2005 | Thornley et al. ............. 326/16 |

FOREIGN PATENT DOCUMENTS

JP   09-306965   11/1997

* cited by examiner

*Primary Examiner*—Dinh T. Le
(74) *Attorney, Agent, or Firm*—Arent Fox PLLC

(57) ABSTRACT

An input circuit writes an expected value to one end of an evaluation wiring. A latch circuit latches a logic level of the other end of the evaluation wiring. A first switch circuit connects an output of the input circuit to the input of the latch circuit. A second switch circuit connects the output of the input circuit to the one end of the evaluation wiring. A third switch circuit connects the other end of the evaluation wiring to the input of the latch circuit. By turning on, off, and off the first to third switch circuits, respectively, the output of the input circuit is directly connected to only the input of the latch circuit. In this state, the input circuit writes an expected value, and a logic level is read from the latch circuit. Accordingly, failure of the evaluation wiring can be easily discriminated from other failure.

19 Claims, 12 Drawing Sheets

| operating state | WE1 | DIN1 | ND1 | ND2 | /OUT | OUT |
|---|---|---|---|---|---|---|
| standby | 0 | 0 | 1 | 1 | hold | hold |
| standby | 0 | 1 | 1 | 1 | hold | hold |
| logic "0" write | 1 | 0 | 0 | 1 | 1 | 0 |
| logic "1" write | 1 | 1 | 1 | 0 | 0 | 1 |

Fig. 4

| evaluation mode | SW1 | SW2 | SW3 | write | read | judgement |
|---|---|---|---|---|---|---|
| bypass mode MODE1,0=(0,0) | ON | OFF | OFF | 1 | 1 | no failure of peripheral circuit |
| | | | | 0 | 0 | |
| | | | | 1 | 0 | failure of peripheral circuit |
| | | | | 0 | 1 | |
| wiring evaluation mode MODE1,0=(0,1) | OFF | ON | ON | 1 | 1 | no failure of evaluation wiring |
| | | | | 0 | 0 | |
| | | | | 1 | 0 | failure of evaluation wiring (break or short) |
| | | | | 0 | 1 | |
| break/short mode MODE1,0=(1,0), (1,1) | ON ⇨ OFF | ON or OFF ⇨ ON | ON ⇨ ON | 1 | 1 | break of evaluation wiring |
| | | | | 0 | 0 | |
| | | | | 1 | 0 | "1" short failure of evaluation wiring |
| | | | | 0 | 1 | "0" short failure of evaluation wiring |

Fig. 5

| evaluation mode | SW1 | SW2 | SW3 | SW4 | write | read | judgement |
|---|---|---|---|---|---|---|---|
| bypass mode MODE1,0=(0,0) | ON | OFF | OFF | OFF | 1 | 1 | no failure of peripheral circuit |
| | | | | | 0 | 0 | |
| | | | | | 1 | 0 | failure of peripheral circuit |
| | | | | | 0 | 1 | |
| wiring evaluation mode MODE1,0=(0,1) | OFF | ON | ON | OFF | 1 | 1 | no failure of evaluation wiring |
| | | | | | 0 | 0 | |
| | | | | | 1 | 0 | failure of evaluation wiring (break or short) |
| | | | | | 0 | 1 | |
| break/ short mode MODE1,0=(1,0), (1,1) | ON or OFF ⇨ OFF | ON or OFF ⇨ ON | ON or OFF ⇨ ON | ON ⇨ OFF | 1 | 1 | break of evaluation wiring |
| | | | | | 0 | 0 | |
| | | | | | 1 | 0 | "1" short failure of evaluation wiring |
| | | | | | 0 | 1 | "0" short failure of evaluation wiring |

Fig. 9

SEMICONDUCTOR INTEGRATED CIRCUIT AND EVALUATION METHOD OF WIRING IN THE SAME

CROSS-REFERENCE TO RELATED APPLICATIONS

This application is based upon and claims the benefit of priority from the prior Japanese Patent Application No. 2003-427603, filed on Dec. 24, 2003, the entire contents of which are incorporated herein by reference.

BACKGROUND OF THE INVENTION

1. Field of the Invention

The present invention relates to a semiconductor integrated circuit having a wiring evaluation circuit for evaluating wiring formed on a chip when a semiconductor fabrication process or the like is developed, and to an evaluation method of the wiring in the semiconductor integrated circuit.

2. Description of the Related Art

When a new semiconductor fabrication process is developed, an evaluation chip is generally used to evaluate the shape of wiring fabricated by this process, the characteristics of elements, and so on. On the evaluation chip, a wiring evaluation circuit, an element evaluation circuit, and so on are formed. In the wiring evaluation circuit, a plurality of kinds of evaluation wirings with different wiring widths and wiring intervals are formed. Then, failure (break, short, and so on) occurring in each of the evaluation wirings is evaluated, thereby determining optimum fabrication process conditions and process margins. In other words, a semiconductor fabrication process is developed.

For example, Japanese Unexamined Patent Application Publication No. Hei 9-306965 proposes a wiring evaluation circuit having a write circuit formed on an input side of an evaluation wiring and a read circuit formed on an output side of the evaluation wiring via a latch circuit. In this wiring evaluation circuit, the write circuit gives a predetermined logic level (expected value) to the evaluation wiring, the read circuit reads a logic level held by the latch circuit, and a read value is compared with the expected value, thereby detecting failure of each evaluation wiring.

SUMMARY OF HE INVENTION

According to one of the aspects of the semiconductor integrated circuit of the present invention, an input circuit is connected to one end of an evaluation wiring and writes a predetermined logic level to the one end. A latch circuit is connected to the other end of the evaluation wiring and latches a logic level of the other end. A first switch circuit connects an output of the input circuit to an input of the latch circuit. A second switch circuit connects the output of the input circuit to the one end of the evaluation wiring. A third switch circuit connects the other end of the evaluation wiring to the input of the latch circuit. An output circuit reads the logic level latched by the latch circuit.

For example, when the first switch circuit is turned on and the second and third switch circuits are turned off, the evaluation wiring is disconnected from the input circuit and the latch circuit. The output of the input circuit is directly connected to the input of the latch circuit. In this state, a predetermined logic level (expected value) is written from the input circuit and a logic level latched by the latch circuit is read via the output circuit, so that failure of circuits (for example, the input circuit or the latch circuit) other than the evaluation wiring can be detected. Failure of the evaluation wiring and other failure can be easily discriminated from each other, which enables reduction in the development period of a semiconductor fabrication process.

According to another aspect of the semiconductor integrated circuit of the present invention, a switch control circuit outputs a first switch control signal, a second switch control signal, and a third switch control signal that control ON/OFF of the first switch circuit, the second switch circuit, and the third switch circuit, respectively. Therefore, the switch control circuit can set the first to third switch circuits to desired states (ON or OFF).

According to another aspect of the semiconductor integrated circuit of the present invention and an evaluation method of wiring in the semiconductor integrated circuit, the switch control circuit turns on the first switch circuit and turns off the second and third switch circuits during a bypass mode for detecting failure of circuits except the evaluation wiring. Then, the input circuit writes a predetermined level (expected value) directly to the latch circuit. When a logic level read by the output circuit is different from the expected value, the circuits except the evaluation wiring are judged to have failure. When the logic level read by the output circuit is equal to the expected value, the circuits except the evaluation wiring are judged to have no failure. The states of the first to third switch circuits are thus set for the bypass mode, so that failure of the evaluation wiring and other failure can be easily discriminated from each other.

According to still another aspect of the semiconductor integrated circuit of the present invention, the switch control circuit turns off the first switch circuit and turns on the second and third switch circuits during a wiring evaluation mode for detecting failure of the evaluation wiring. Thereafter, the input circuit writes the predetermined logic level (expected value) to the evaluation wiring. The latch circuit latches via the evaluation wiring the logic level outputted from the input circuit. When the logic level read by the output circuit is different from the expected value, the evaluation wiring is judged to have one of break failure and short failure. When the logic level read by the output circuit is equal to the expected value, the evaluation wiring is judged to have no failure. The states of the first to third switch circuits are thus set for the wiring evaluation mode, so that it can be easily judged whether or not the evaluation wiring has failure. Especially when the evaluation in the wiring evaluation mode is executed after it is confirmed by the evaluation in the bypass mode that no failure exists in other place than the evaluation wiring, failure of the evaluation wiring can be surely detected. As a result, the development period of a semiconductor fabrication process can be shortened.

According to yet another aspect of the semiconductor integrated circuit of the present invention, the third switch circuit is a bi-directional switch allowing bi-directional transmission of a logic level. During a break/short mode for discriminating which one of break failure and short failure exists in the evaluation wiring, the switch control circuit turns on the first and third switch circuits and then turns on or off the second switch circuit.

Thereafter, the input circuit writes the predetermined logic level (expected value) to the evaluation wiring. When the evaluation wiring has a break, the predetermined logic level is also written to the other end of the evaluation wiring via the first and third switch circuits. Next, the switch control circuit turns off the first switch circuit and turns on the second and third switch circuits. Thereafter, the output circuit reads the logic level latched by the latch circuit.

When the read logic level is different from the expected value, the evaluation wiring is judged to have the short failure. When the read logic level is equal to the expected value, the evaluation wiring is judged to have the break failure.

The states of the first to third switch circuits are thus set for the break/short mode, so that it can be easily discriminated which one of break failure and short failure is in the evaluation wiring. Especially when the evaluation in the break/short mode is executed after it is confirmed by the evaluation in the bypass mode and the wiring evaluation mode that only the evaluation wiring has failure, break failure and short failure of the evaluation wiring can be surely detected.

According to yet another aspect of the semiconductor integrated circuit of the present invention, the evaluation wiring is constituted of wire pieces formed by using a plurality of wiring layers, respectively, and vias connecting the wire pieces of the different wiring layers to each other. Therefore, it is possible to detect not only failure of the wire pieces but also failure of the vias.

According to yet another aspect of the semiconductor integrated circuit of the present invention, the input circuit and the latch circuit are constituted as a monitor circuit having a first and a second NAND gates. The first NAND gate has one input receiving a signal with a logic equal to a logic of write data, the other input connected to an output of the second NAND gate, and an output connected to the first and second switch circuits. The second NAND gate has one input receiving a signal with a logic inverse to the logic of the write data, the other input connected to the first and third switches, and an output connected to the output circuit.

For example, when "logic 1" is written to the input circuit, the first NAND gate receives "logic 1" at the one input thereof. The second NAND gate receives "logic 0" at the one input thereof and outputs "logic 1". Therefore, the first NAND gate outputs "logic 0" to the evaluation wiring. Thereafter, the one input of each of the first and second NAND gates is set to "logic 1", so that the written "logic 1" is held by the first and second NAND gates and the first NAND gate keeps outputting "logic 0".

When the evaluation wiring has no failure, the other input of the second. NAND gate receives "logic 0", so that the second NAND gate keeps outputting "logic 1". On the other hand, when the evaluation wiring has, for example, "logic 1" short failure, both of the inputs of the second NAND gate receive "logic 1", and the second NAND gate changes the output level from "logic 1" to "logic 0". When the inverse logic level to the written "logic 1 (expected value)" is thus read, failure is detected. The input circuit and the latch circuit are constituted of the first and second NAND gates, which enables reliable detection of failure of the evaluation wiring with a simple circuit.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 4 is an explanatory table showing a basic operation of a monitor circuit shown in FIG. 3;

FIG. 5 is an explanatory table showing the operation of a wiring evaluation circuit in the first embodiment;

FIG. 9 is an explanatory table showing the operation of a wiring evaluation circuit in the second embodiment;

DESCRIPTION OF THE PREFERRED EMBODIMENTS

Figure 1:
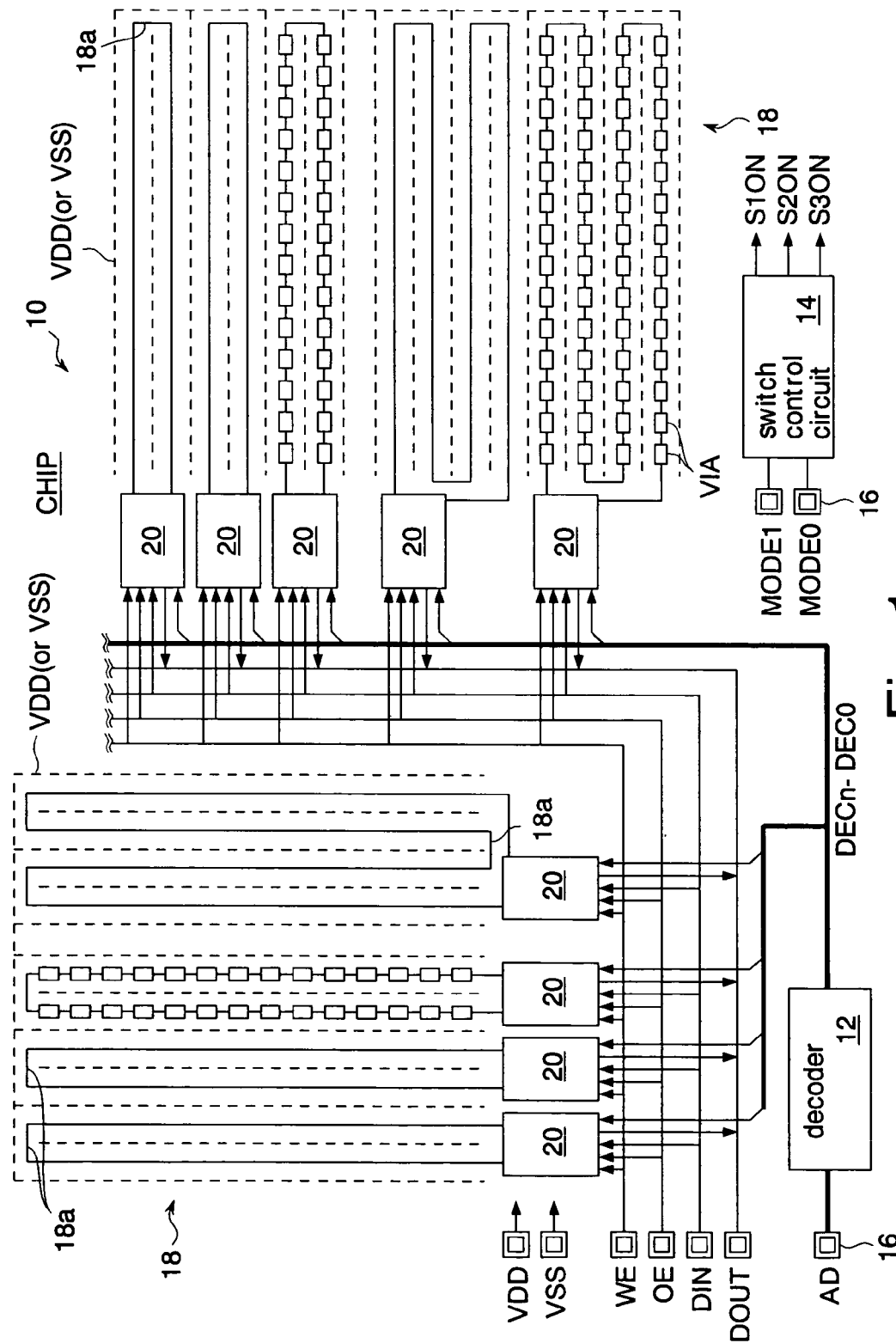
FIG. 1 is a block diagram showing a first embodiment of the present invention.

The present invention is made to solve the following problem. When a logic level read by a read circuit is different from a logic level given to a write circuit (for example, when "logic 0" is written to an evaluation wiring and "logic 1" is read), the occurrence of failure on an evaluation chip is detected, but it is not possible to discriminate which one of a break and a short the evaluation wiring has. This is because a latch circuit holds one of "logic 0" and "logic 1" even when the evaluation wiring has a break.

Further, when the logic level read by the read circuit is different from an expected value, it is not possible to discriminate which one of the evaluation wiring and a peripheral circuit adjacent to the evaluation wiring has failure.

In recent years, the integration degree of a semiconductor chip has become high in order to realize a high function, and the density of wiring patterns thereof has become high. Consequently, it is becoming difficult to analyze failure resulting from wiring in a short time. In other words, there is a demand for realizing easy analysis of failure resulting from wiring in order to develop a new semiconductor fabrication process in a short time.

It is an object of the present invention to easily discriminate failure resulting from wiring, thereby shortening the development period of a semiconductor fabrication process. It is another object of the present invention to easily discriminate failure occurring in an evaluation wiring from failure occurring in places other than the evaluation wiring, thereby shortening the development period of a semiconductor fabrication process.

Hereinafter, embodiments of the present invention will be described, using the drawings. In the drawings, each signal line shown by the heavy line is constituted of a plurality of lines. Part of blocks to which the heavy lines are connected is constituted of a plurality of circuits. The same reference numerals and symbols as those of signals are used to designate signal lines through which the signals are transmitted. In the description below, abbreviation such as "a WE signal" is sometimes used to refer to a signal name such as "a write enable signal WE".

FIG. 1 shows a first embodiment of the semiconductor integrated circuit of the present invention. This semiconductor integrated circuit is formed on a silicon substrate as an evaluation chip CHIP for evaluating a semiconductor fabrication process, through the use of a CMOS process. On the evaluation chip CHIP, provided are wiring evaluation circuits 10 for evaluating the shape of wiring formed on the chip, an element evaluation circuit (not shown) for evaluating the characteristics of elements such as transistors and resistors, and so on. The element evaluation circuit evaluates an electrical characteristic (DC characteristic) of a single element and a performance characteristic (AC characteristic) of a circuit constituted of a plurality of elements. Each of the wiring evaluation circuits 10 evaluates a process condition under which a break occurs in the wiring and a process condition under which a short occurs in the wiring. In other words, the process conditions and process margins are evaluated for preventing a break and a short of the wiring.

In addition to the plural wiring evaluation circuits 10, the evaluation chip CHIP has thereon a decoder 12, a switch control circuit 14, and a plurality of pads 16 being external terminals, all of which are shared by the wiring evaluation circuits 10. Each of the wiring evaluation circuits 10 has an evaluation wiring 18 and a control circuit 20. In some of the wiring evaluation circuits 10, the evaluation wirings 18 extend in a lengthwise direction of the evaluation chip CHIP, and in the other wiring evaluation circuits 10, the evaluation wirings 18 extend in a widthwise direction of the evaluation chip CHIP. The evaluation wirings 18 are connected to the control circuits 20 at both ends thereof and each has at least one fold part 18*a*.

The broken lines adjacent to the evaluation wirings 18 show power supply lines VDD (or VSS). The evaluation wirings 18 and the power supply lines VDD (or VSS) are wired in parallel to each other at predetermined wiring intervals. The wiring interval is set for each of the wiring evaluation circuit 10. The wiring width of the evaluation wiring 18 is also set to a predetermined value for each of the wiring evaluation circuits 10. Thus, the wiring evaluation circuit 10 has one of the plural kinds of the evaluation wirings 18 (they are different from each other in wiring width and wiring interval). In order to simplify the explanation, the differences in the wiring width and wiring interval of the evaluation wirings 18 and the power supply lines VDD (or VSS) are not shown. The shapes of the evaluation wirings 18 shown in FIG. 1 (a U-shape and a meandering shape) are only examples, and shapes other than those in the drawing also exist.

In the drawing, the rectangular shapes shown on the evaluation wirings 18 show vias VIA for connecting wire pieces to each other, the wire pieces being formed by using a plurality of wiring layers respectively. In other words, each of the evaluation wirings 18 having the vias VIA is formed by using the plural wiring layers. Each of the evaluation wiring 18 not having the vias VIA is formed by using one of the plural wiring layers.

The decoder 12 decodes an address signal AD supplied from an external part of the evaluation chip CHIP, and activates one of decoded signals DEC (DEC0 to DECn) corresponding to the respective wiring evaluation circuits 10 to "logic 1".

In response to mode signals MODE1, MODE0 supplied from the external part of the evaluation chip CHIP according to later-described evaluation modes shown in FIG. 5, the switch control circuit 14 sets first to third switch control signals S1ON, S2ON, S3ON to predetermined logic levels respectively. Later-described first to third switch circuits SW1, SW2, SW3 of the control circuit 20 shown in FIG. 3 turn on when the respective switch control signals S1ON, S2ON, S3ON have "logic 1 (high level)", and turns off when they have "logic 0 (low level)".

Each of the control circuits 20 has a function of giving a predetermined logic level to one end of the evaluation wiring 18 and detecting a logic level of the other end of the evaluation wiring 18. In this embodiment, only the control circuit 20 corresponding to the activated decoded signal DEC (one of DEC0 to DECn) is activated to operate. The activated control circuit 20 receives a data input signal DIN (the logic level to be given to the evaluation wiring 18) in response to a write enable signal WE, and outputs a data output signal DOUT (the detected logic level of the evaluation wiring 18) in response to an output enable signal OE.

The evaluation wirings 18 are evaluated one by one while the control circuit 20 to operate is changed in sequence based on the address signal AD. Signal lines of the write enable signal WE, the data input signal DIN, the output enable signal OE, and the data output signal DOUT are wired so as to be shared by the wiring evaluation circuits 10.

Figure 2:
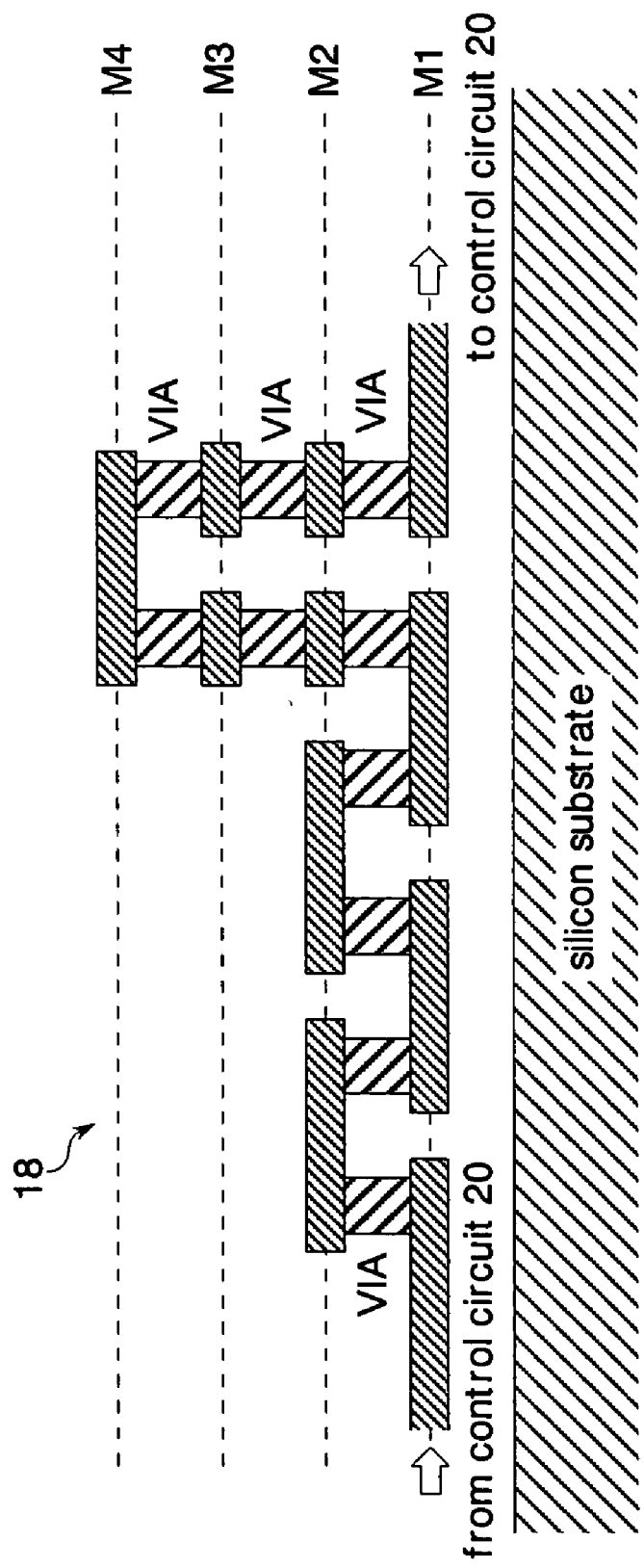
FIG. 2 is a cross sectional view showing an example of an evaluation wiring having vias.

FIG. 2 shows an example of the evaluation wiring 18 having the vias VIA. The evaluation wiring 18 is constituted of the wire pieces, which are formed by using a first metal wiring layer M1 to a fourth metal wiring layer M4 respectively on a silicon substrate, and the vias VIA connecting the wire pieces of adjacent wiring layers (for example, M1 and M2) to each other. The formation interval of the vias VIA is set to a predetermined value for each of the wiring evaluation circuits 10.

Figure 3:
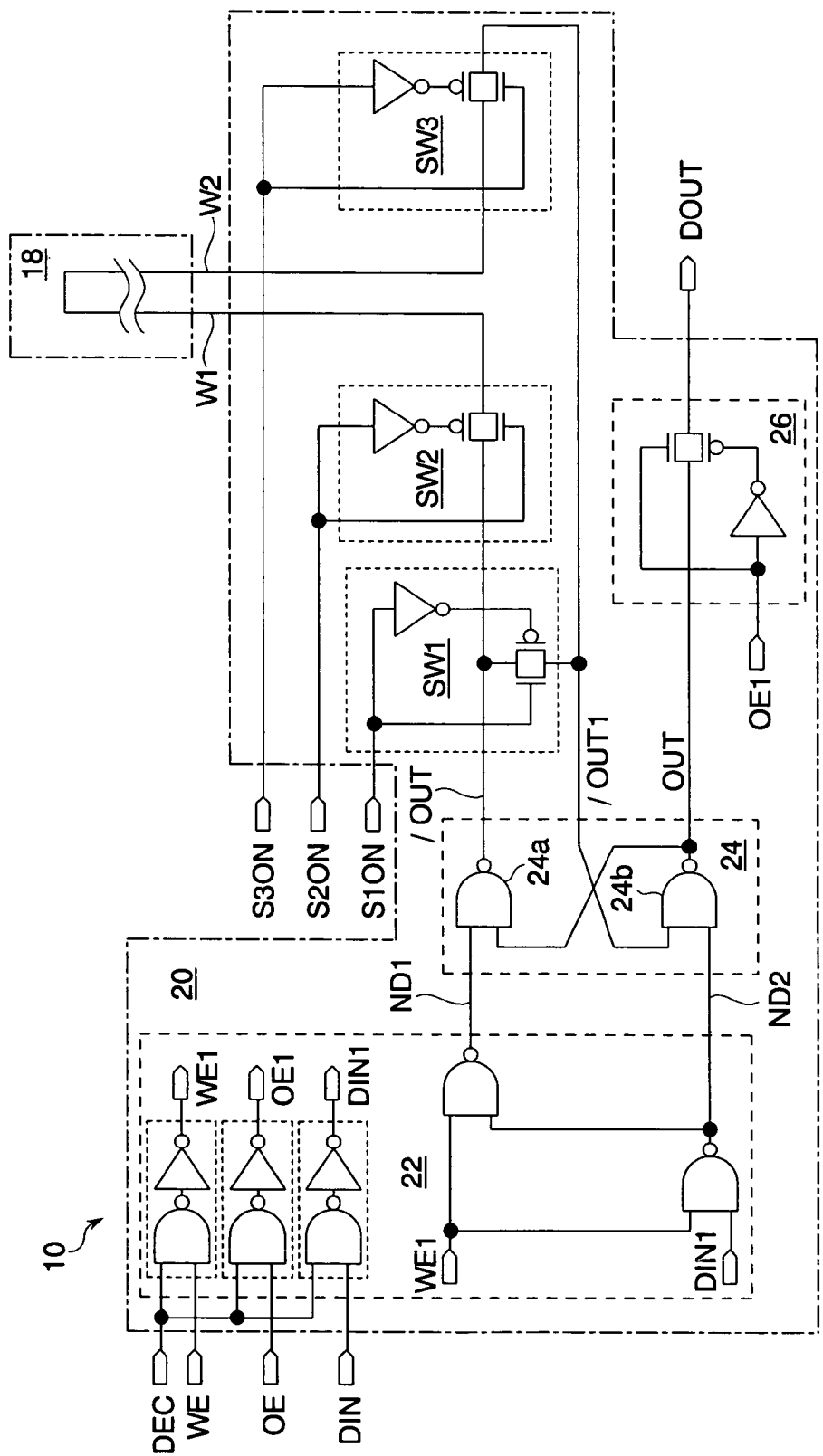
FIG. 3 is a circuit diagram showing in detail a control circuit shown in FIG. 1.

FIG. 3 shows in detail the control circuit 20 shown in FIG. 1. The control circuit 20 has an input control circuit 22, a monitor circuit 24, switch circuits SW1, SW2, SW3, and an output control circuit 26.

The input control circuit 22 has three AND circuits and two NAND gates. The AND gates output the WE signal, the OE signal, and the DIN signal as an internal write enable signal WE1, an internal output enable signal OE1, and an internal data input signal DIN1 respectively while the corresponding decoded signal DEC is activated. The NAND gates give high level (logic 1) to nodes ND1, ND2 respectively while the WE1 signal is deactivated (logic 0). Further, the NAND gates give a signal with the same logic as that of the DIN1 signal to the node ND1 and a signal with the logic inverse to that of the DIN1 signal to the node ND2, respectively, while the WE1 signal is activated (logic 1).

The monitor circuit 24 is configured such that an input and an output of a first NAND gate 24*a* are connected to an output and an input of a second NAND gate 24*b* respectively.

Note that the output (a node /OUT) of the first NAND gate 24*a* is connected to the input (a node /OUT1) of the second NAND gate 24*b* via the switch circuit SW1 or via the switch circuit SW2, the evaluation wiring 18, and the switch circuit SW3. The first NAND gate 24*a* and the second NAND gate 24*b* operate as an input circuit that writes a predetermined logic level to one end W1 of the evaluation wiring 18 and as a latch circuit that latches a logic level of the other end W2 of the evaluation wiring 18.

Each of the switch circuits SW1, SW2, SW3 is constituted of a CMOS transmission gate and an inverter connected to a gate of a pMOS transistor of this transmission gate. When the switch control signal S1ON has "logic 1", the transmission gate of the switch circuit SW1 turns on, so that the node /OUT is connected to the node /OUT1. When the switch control signal S2ON has "logic 1", the transmission gate of the switch circuit SW2 turns on, so that the node /OUT is connected to the one end W1 of the evaluation wiring 18.

When the switch control signal S3ON has "logic 1", the transmission gate of the switch circuit SW3 turns on, so that the other end W2 of the evaluation wiring 18 is connected to the node /OUT1.

The output control circuit 26 is constituted of a CMOS transmission gate and an inverter connected to a gate of a pMOS transistor of this transmission gate. When the OE1 signal has "logic 1", the output control circuit 26 turns on to connect the output node OUT of the monitor circuit 24 to the signal line of the DOUT signal. Therefore, data held by the monitor circuit 24 is outputted as the DOUT signal by an ON operation of the output control circuit 26.

FIG. 4 shows a basic operation of the monitor circuit 24 shown in FIG. 3. Here, explanation will be given on a case where the node /OUT and the node /OUT1 shown in FIG. 3 are connected to each other, in other words, where the wiring evaluation circuit 10 has no failure. The monitor circuit 24 has three operating states, namely, "standby", "logic 0 write", and "logic 1 write".

The "standby" is a state when the WE1 signal has "logic 0". The monitor circuit 24 holds a previous state during the "standby" irrespective of the logic level of the DIN1 signal.

The "logic 0 write" is a state when the WE1 signal has "logic 1" and the DIN1 signal has "logic 0". During this sate, the monitor circuit 24 outputs "logic 1" to the node /OUT and outputs "logic 0" to the node OUT. Therefore, "logic 0" is written to the monitor circuit 24. The "logic 1 write" is a state when the WE1 signal has "logic 1" and the DIN1 signal has "logic 1". During this state, the monitor circuit 24 outputs "logic 0" to the node /OUT and outputs "logic 1" to the node OUT. Therefore, "logic 1" is written to the monitor circuit 24.

In the evaluation of the evaluation wiring 18, the switch circuits SW1, SW2, SW3 shown in FIG. 3 are turned on or off to shift the state of the monitor circuit 24 from the "logic 0 write state" or "logic 1 write state" to the "standby state". Then, the logic level held by the monitor circuit 24 to be read via the output control circuit 26 in FIG. 3 is compared with an expected value, thereby detecting failure of the evaluation wiring 18 and so on.

FIG. 5 shows the operation of the wiring evaluation circuit 10 in the first embodiment. In the present invention, the wiring evaluation circuit 10 is used to execute three kinds of evaluations, namely, a bypass mode, a wiring evaluation mode, and a break/short mode. These modes are switched over based on the logic levels of the mode signals MODE1, MODE0 supplied via the external terminals. In the bypass mode, failure of a circuit (peripheral circuit) except the evaluation wiring 18 is detected. In the wiring evaluation mode, failure of the evaluation wiring 18 is detected. In the break/short mode, it is discriminated which one of a break and a short the failure of the evaluation wiring 18 is. The evaluations in the bypass mode, the wiring evaluation mode, and the break/short mode are executed in this order.

Figure 12:
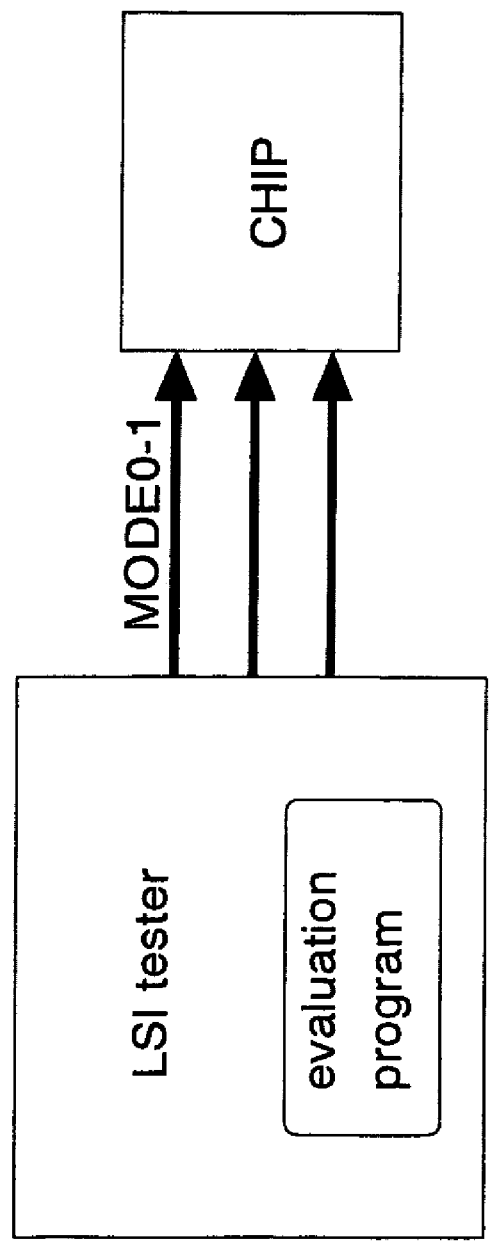
FIG. 12 is a block diagram showing an LSI tester for evaluating an evaluation chip, in accordance with one example of the present invention.

In the wiring evaluation as shown in FIG. 12, the evaluation chip CHIP is connected to an LSI tester or the like, so that the evaluation chip CHIP is operated by the LSI tester. In other words, the LSI tester executes an evaluation program to evaluate the evaluation wiring 18.

While the switch control circuit 14 is receiving the mode signals MODE1, MODE0=(0, 0) from the LSI tester, the evaluation mode is set to the bypass mode. In response to the mode signals MODE1, MODE0, the switch control circuit 14 sets the switch circuits SW1, SW2, SW3 to ON, OFF, and OFF respectively. The switch circuit SW1 turns on and the switch circuits SW2, SW3 turn off, so that the node /OUT of the monitor circuit 24 is directly connected to the node /OUT1 not via the evaluation wiring 18. This means that the evaluation wiring 18 is brought to a floating state. In this state, the "logic 0 write" and "logic 1 write" shown in FIG. 4 are executed in sequence. When all the logic levels read after the write are the same as the written logic levels, it is judged that a peripheral circuit (for example, the monitor circuit 24 or the switch circuits SW1 to SW3) adjacent to the evaluation wiring 18 has no failure. When at least one logic level different from the written logic level is read, it is judged that the peripheral circuit adjacent to the evaluation wiring 18 has failure. Thus, in the wiring evaluation circuit 10, failure of a peripheral circuit, which has been conventionally impossible to detect, can be detected.

While the switch control circuit 14 is receiving the mode signals MODE1, MODE0 (0, 1) from the LSI tester, the evaluation mode is set to the wiring evaluation mode. In response to the mode signals MODE1, MODE0, the switch control circuit 14 sets the switch circuit SW1, SW2, SW3 to OFF, ON, and ON respectively. The switch circuit SW1 turns off and the switch circuits SW2, SW3 turn on, so that the node /OUT of the monitor circuit 24 is connected to the node /OUT1 via the evaluation wiring 18. In this state, the "logic 0 write" and "logic 1 wirte" are executed in sequence. When all the logic levels read after the write are the same as the written logic levels, it is judged that the evaluation wiring 18 has no failure. When at least one logic level different from the written logic level is read, it is judged that the evaluation wiring 18 has failure. At this instant, however, it is not certain whether the evaluation wiring 18 has a break or a short with a different wiring line. In order to discriminate which one of a break and a short is the cause of the failure, the break/short mode is executed.

If a driving capability of the monitor circuit 24 is high when the evaluation wiring 18 is short-circuited with a power supply line or the like via a high resistance component (weak short), it is not sometimes possible to detect failure. In order to detect such kind of failure, the switch circuit SW2 may be turned off a predetermined time before a read operation. In this case, executing the evaluation with the predetermined time being varied facilitates estimating a failure mode. It is not certain at this instant whether the evaluation wiring 18 has a break or a short with a different wiring line. In order to discriminate which one of a break and a short is the cause of the failure, the break/short mode is executed.

While the switch control circuit 14 is receiving the mode signals MODE1, MODE0 (1, 0) or (1, 1) from the LSI tester, the evaluation mode is set to the break/short mode. First, in response to the mode signals MODE1, MODE0 (1, 0), the switch control circuit 14 sets both the switch circuits SW1, SW3 to ON and the switch circuit SW to ON or OFF. The switch circuits SW1, SW3 turn on, so that the node OUT of the monitor circuit 24 is connected to the other end W2 of the evaluation wiring 18 via the switch circuit SW1, the node /OUT1, and the switch circuit SW3. In this state, the "logic 0 write" or "logic 1 write" is executed. The evaluation wiring 18 is charged with a voltage corresponding to an inverse logic level to the written logic level by the "logic 0 write" or "logic 1 write".

After the evaluation wiring 18 is charged, the switch control circuit 14 receives the mode signals MODE1, MODE0=(1, 1) to set the switch circuits SW1, SW2, SW3 to OFF, ON, and ON respectively. Thereafter, the output control circuit 26 turns on and the data held by the monitor circuit 24 is read. When the evaluation wiring 18 has a break, an output level of the monitor circuit 24 supplied via the switch circuit SW2 is not transmitted to the other end W2 of the evaluation wiring 18, so that the other end W2 side of the evaluation wiring 18 is brought to a floating state. Therefore, the monitor circuit 24 holds the written logic level. In other words, it is judged that the evaluation wiring 18 has a break when all the logic levels read in the read operation after the "logic 0 write" and "logic 1 write" are the same as the written logic levels.

When the evaluation wiring 18 is short-circuited with the adjacent power supply line (VDD or VSS) or circuit, the voltage level of the evaluation wiring 18 changes depending on the voltage of the opponent of the short-circuit, irrespective of the output level of the monitor circuit 24. For example, even when "logic 1" is written to the monitor circuit 24 and the monitor circuit 24 outputs "logic 0" to the output node /OUT, if the evaluation wiring 18 is short-circuited with the power supply line VDD, the node /OUT1 has "logic 1". The logic level of the monitor circuit 24 inverts from "logic 1" to "logic 0". Even when "logic 0" is written to the monitor circuit 24 and the monitor circuit 24 outputs "logic 1" to the output node /OUT, if the evaluation wiring 18 is short-circuited with the ground line VSS, the node /OUT1 has "logic 0" and the logic level of the monitor circuit 24 inverts from "logic 0" to "logic 1". Incidentally, if the switch circuit SW2 is turned off a predetermined time before the read operation as in the above-described wiring evaluation mode, a resistive short (weak short) can be detected.

Thus, when at least one logic level different from the written logic level is read, the evaluation wiring 18 is judged to be short-circuited with an adjacent wiring line or an adjacent peripheral circuit. In more detail, when "logic 0" is constantly read irrespective of the written logic levels, the evaluation wiring 18 is judged to be short-circuited with the power supply line VDD or the like. When "logic 1" is constantly read irrespective of the written logic levels, the evaluation wiring 18 is judged to be short-circuited with the power supply line VSS (ground line) or the like.

Figure 6:
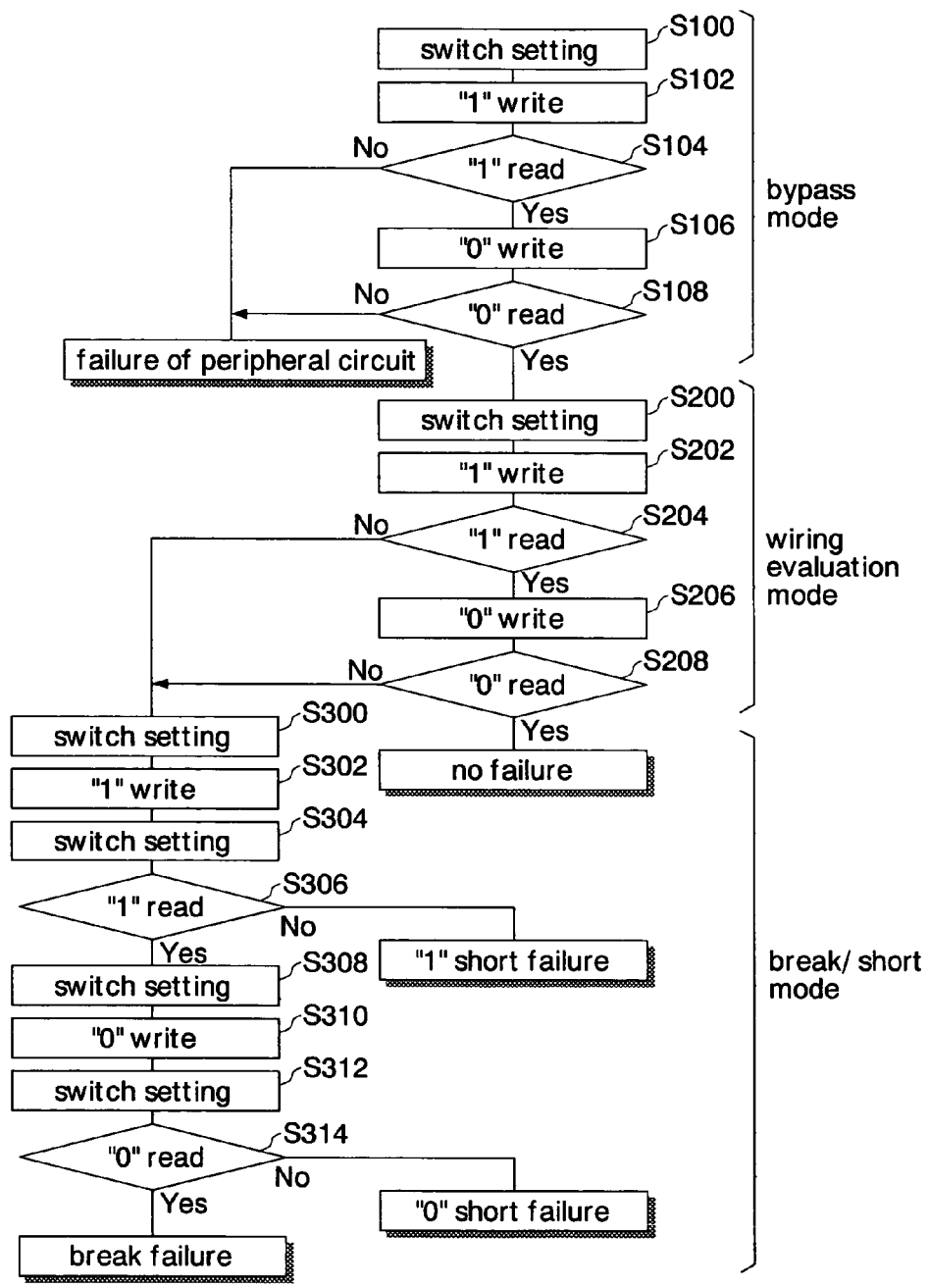
FIG. 6 is a flowchart showing the procedure for evaluating an-evaluation chip using the wiring evaluation circuit of the present invention.

FIG. 6 shows the procedure for evaluating the evaluation chip, using the wiring evaluation circuit of the present invention. This flow is executed by the LSI tester to which the evaluation chip is connected. Steps S100 to S108 show the evaluation in the bypass mode. Steps S200 to S208 show the evaluation in the wiring evaluation mode. Steps S300 to S316 show the evaluation in the break/short mode.

First, at Step S100, the switch circuits SW1, SW2, SW3 are set to the states for the bypass mode shown in FIG. 5. At Step S102, "a logic 1 write operation" is executed. At Step S104, when "logic 1" that is an expected value is read, it is judged that no "logic 1" failure in the bypass mode exists, and the process goes to Step S106. When "logic 1" that is the expected value is not read (when "logic 0" is read), it is judged that failure exists in a place other than the evaluation wiring 18, in other words, that a peripheral circuit adjacent to the evaluation wiring 18 has failure, and the evaluation is finished.

At Step S106, "a logic 0 write operation" is executed. At Step SI 08, when "logic 0" that is an expected value is read, it is judged that a "logic 0" failure in the bypass mode does not exist, and the process goes to Step S200 of the wiring evaluation mode. When "logic 0" that is the expected value is not read (when "logic 1" is read), it is judged that failure exists in a place other than the evaluation wiring 18, and the evaluation is finished.

Next at Step S200, the switch circuits SW1, SW2, SW3 are set to the states for the wiring evaluation mode shown in FIG. 5. At Step S202, "a logic 1 write operation" is executed. At Step S204, when "logic 1" that is an expected value is read, the process goes to Step S206. When "logic 1" that is the expected value is not read (when "logic 0" is read), it is judged that the evaluation wiring 18 has failure, and the process goes to Step S300 of the break/short mode.

At Step S206, "a logic 0 write operation" is executed. At Step S208, when "logic 0" that is an expected value is read, it is judged that the evaluation chip CHIP has no failure, and the evaluation is finished. When "logic 0" that is the expected value is not read (when "logic 1" is read), it is judged that the evaluation wiring 18 has failure, and the process goes to Step S300 of the break/short mode.

Next, at Step S300, the switch circuits SW1, SW2, SW3 are set to the write states for the break/short mode shown in FIG. 5. At Step S302, "a logic 1 write operation" is executed. At Step S304, the switch circuits SW1, SW2, SW3 are set to the read states for the break/short mode shown in FIG. 5. At Step S306, when "logic value 1" that is an expected value is read, the process goes to Step S308. When "logic 1" that is the expected value is not read (when "logic 0" is read), it is judged that the evaluation wiring 18 has a "logic 1" short failure, and the process is finished.

Next, at Step S308, the switch circuits SW1, SW2, SW3 are set to the write states for the break/short mode shown in FIG. 5. At Step S310, "a logic 0 write operation" is executed. At Step S312, the switch circuits SW1, SW2, SW3 are set to the read states for the break/short mode shown in FIG. 5. At Step S314, when "logic 0" that is an expected value is read, it is judged that the evaluation wiring 18 has a break failure, and the process is finished. When "logic 0" that is the expected value is not read (when "logic 1" is read), it is judged that the evaluation wiring 18 has a "logic 0" short failure, and the process is finished.

As described above, in this embodiment, the first to third switch circuits SW1 to SW3 are formed between the output node /OUT and the input node /OUT1 of the monitor circuit 24, between the output node /OUT of the monitor circuit 24 and the one end W1 of the evaluation wiring 18, and between the other end W2 of the evaluation wiring 18 and the input node /OUT1 of the monitor circuit 24, respectively. Consequently, when the first to third switch circuits SW1 to SW3 are set to predetermined states, it is possible to, for example, disconnect the evaluation wiring 18 from the monitor circuit 24 (bypass mode). Therefore, failure of the evaluation wiring can be easily discriminated from failure of a circuit other than the evaluation wiring. Further, it can be easily judged whether the evaluation wiring has failure or not (wiring evaluation mode). Moreover, it can be easily and surely discriminated which one of break failure and short failure is the failure of the evaluation wiring (break/short mode). As a result, the development period of a semiconductor fabrication process can be shortened.

The switch control circuit 14 is operated according to the mode signals MODE1, MODE0 supplied from the LSI tester, so that the first to third switch circuits SW1 to SW3 can be set to desired states (ON or OFF).

The evaluation wiring 18 is constituted of the wire pieces formed by using the plural metal wiring layers M1 to M4 respectively and the vias VIA connecting these wire pieces to each other, and therefore, it is possible to detect not only failure of the wire pieces but also failure of the vias VIA.

The input circuit that writes the predetermined level to the one end W1 of the evaluation wiring 18 and the latch circuit that latches the logic level of the other end W2 of the evaluation wiring 18 are constituted as the monitor circuit 24 formed of the first and second NAND gates 24a, 24b. This configuration makes it possible to have the single monitor circuit 24 function both as the input circuit and the latch circuit, so that failure of the evaluation wiring 18 can be surely detected with a simple circuit.

The power supply line VDD (or VSS) is wired along the evaluation wiring 18, so that the voltage level of the evaluation wiring 18 can be made equal to a voltage level of a power supply when short failure occurs. As a result, the short failure can be easily detected only by writing "logic 1" and "logic 0" to the evaluation wiring 18 in sequence.

Figure 7:
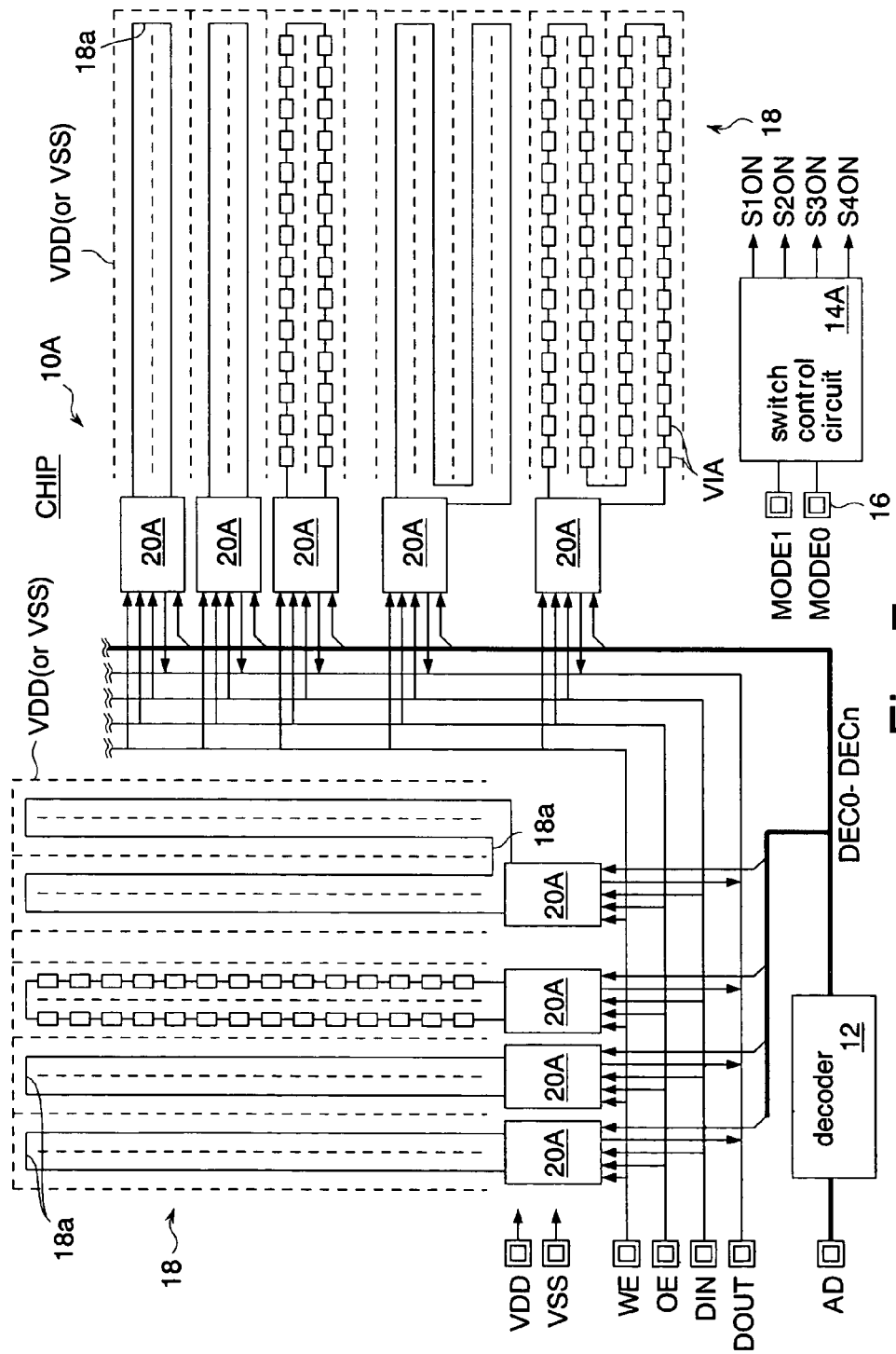
FIG. 7 is a block diagram showing a second embodiment of the present invention.

FIG. 7 shows a second embodiment of the semiconductor integrated circuit of the present invention. The same reference numerals and symbols are used to designate the same elements as the elements described in the first embodiment, and detailed explanation thereof will be omitted.

An evaluation chip CHIP of this embodiment has wiring evaluation circuits 10A and a switch control circuit 14A in place of the wiring evaluation circuits 10 and the switch control circuits 14 of the first embodiment. Each of the wiring evaluation circuits 10A has a control circuit 20A and an evaluation wiring 18. The wiring width and wiring interval of the evaluation wirings 18 are set individually for each of the wiring evaluation circuits 10A. The switch control circuit 14A sets four switch control signals S1ON, S2ON, S3ON, S4ON to predetermined logic levels according to mode signals MODE1, MODE0. The other configuration is the same as that of the first embodiment.

Figure 8:
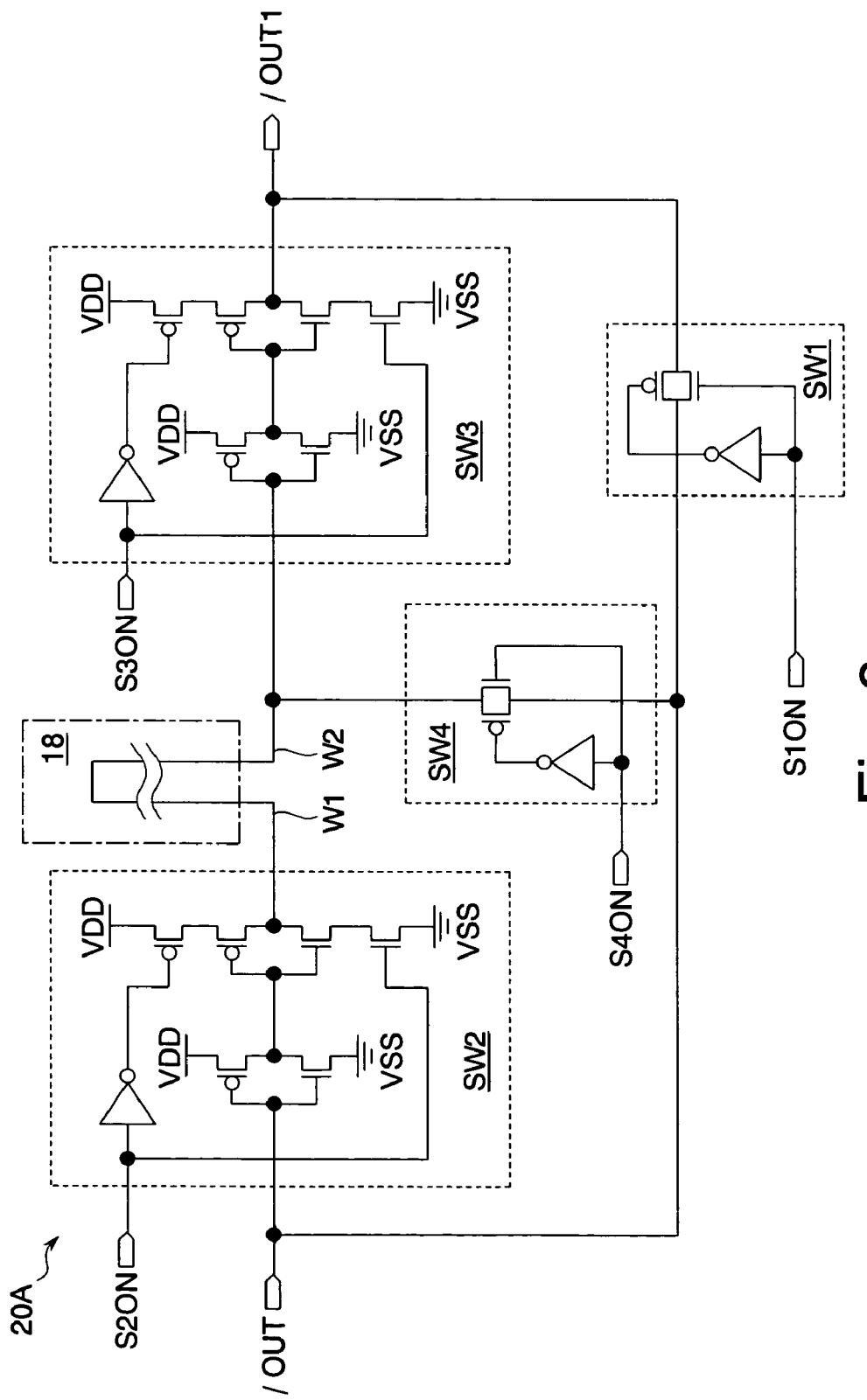
FIG. 8 is a circuit diagram showing in detail an essential portion of a control circuit shown in FIG. 7.

FIG. 8 shows in detail an essential part of the control circuit 20A shown in FIG. 7. The control circuit 20A has switch circuits SW1, SW2, SW3, SW4 in addition to the input control circuit 22, the monitor circuit 24, and the output control circuit 26 shown in FIG. 3.

The switch circuit SW1 is the same as the switch circuit SW1 of the first embodiment. Each of the switch circuits SW2, SW3 is constituted of an inverter and a gated buffer that are connected in cascade, and an inverter connected to a gate of a pMOS transistor of the gated buffer. When the switch control signal S2ON has "logic 1", the gated buffer of the switch circuit SW2 turns on, so that a logic level of a node /OUT is transmitted to one end W1 of the evaluation wiring 18. When the switch control signal S3ON has "logic 1", the gated buffer of the switch circuit SW3 turns on, so that a logic level of the other end W2 of the evaluation wiring 18 is transmitted to a node /OUT1.

The switch circuit SW4 is constituted of a CMOS transmission gate and an inverter connected to a gate of a pMOS transistor of this transmission gate. When the switch control signal S4ON has "logic 1", the transmission gate of the switch circuit SW4 turns on, so that the node /OUT is connected to the other end W2 of the evaluation wiring 18. The switch circuit SW4 is formed in order to transmit a signal (logic level) of the node /OUT1 to the other end W2 of the evaluation wiring 18 in the evaluation of the break/short mode shown in FIG. 9. This configuration is intended for allowing the transmission of the signal (logic level) of the node /OUT1 to the other end W2 of the evaluation wiring 18, which is not possible via the switch circuit SW3.

FIG. 9 shows the operation of the wiring evaluation circuit 10A in the second embodiment. Also in this embodiment, three kinds of evaluations in a bypass mode, a wiring evaluation mode, and a break/short mode are executed. Detailed explanation of the same operations as those of the first embodiment (FIG. 5) will be omitted.

The operation of the switch circuit SW2 is the same as that in the first embodiment. The operations of the switch circuits SW1, SW3 during the bypass mode, the wiring evaluation mode, and a read operation of the break/short mode are the same as those in the first embodiment. The switch circuit SW4 is turned off during the bypass mode and the wiring evaluation mode. The operations of the control circuits 20A during the bypass mode and the wiring evaluation mode are substantially the same as those in the first embodiment.

The switch circuits SW1, SW3 are turned on or off during a write operation of the break/short mode. The switch circuit SW4 is turned on during the write operation of the break/short mode and turned off during the read operation of the break/short. By the ON operation of the switch circuit SW4, the output node /OUT of the monitor circuit 24 can be connected to the other end W2 of the evaluation wiring 18 even when the switch circuit SW3 is constituted of the gated buffer.

In this embodiment, the same effects as those of the above-described first embodiment are also obtainable.

Figure 10:
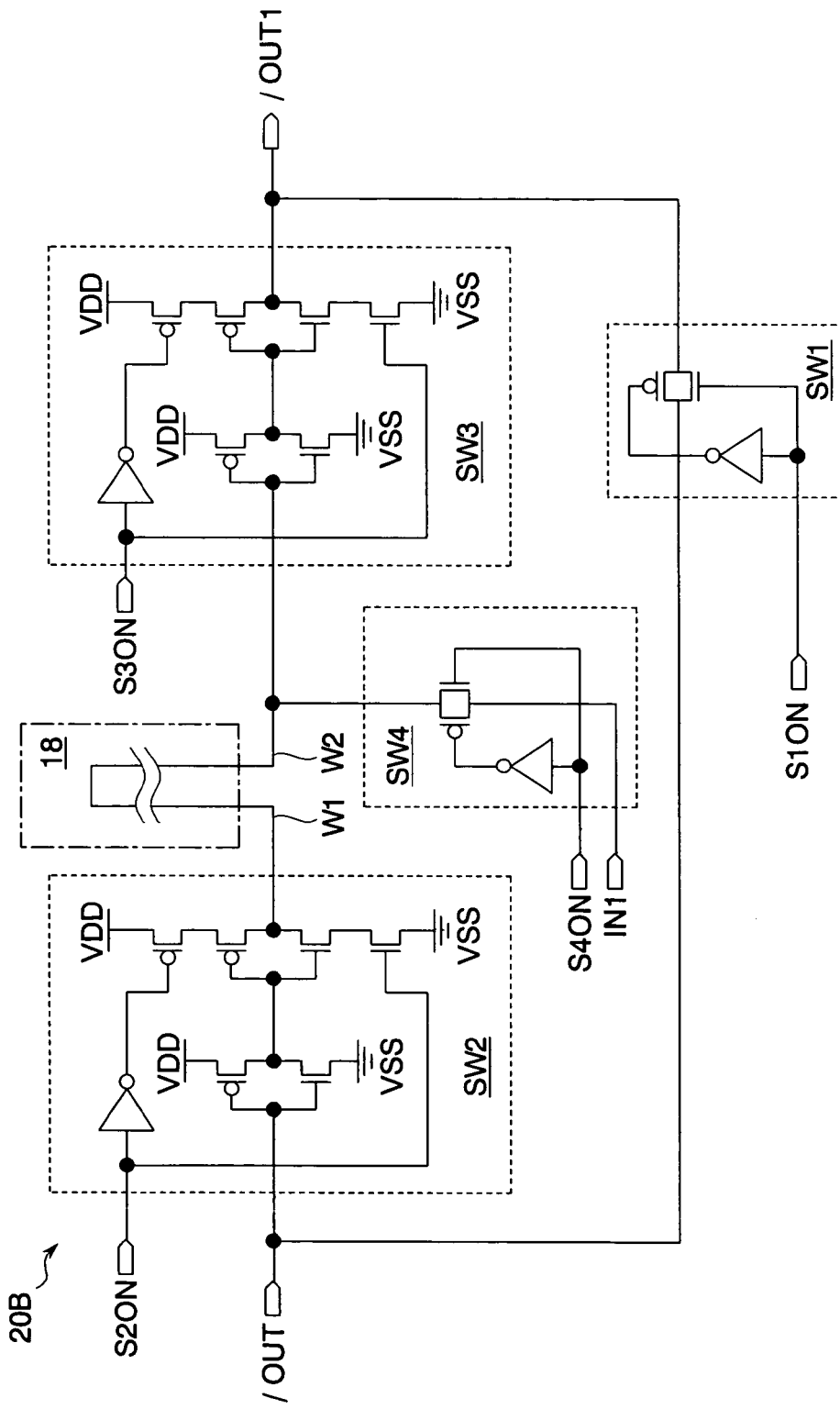
FIG. 10 is a circuit diagram showing in detail an essential portion of a control circuit in a third embodiment of the present invention.

FIG. 10 shows in detail an essential part of a control circuit 20B in a third embodiment of the semiconductor integrated circuit of the present invention. The same reference numerals and symbols are used to designate the same elements as the elements described in the first and second embodiments, and detailed explanation thereof will be omitted.

This embodiment is different from the second embodiment in a logic signal supplied to the other end W2 of an evaluation wiring 18 via a switch circuit SW4 of the control circuit 20B. Specifically, an input of the switch circuit SW4 is connected to a node IN1 instead of a node /OUT.

The node IN1 is directly connected to, for example, an external terminal. A voltage of the node IN1 is directly set by an LSI tester connected to an evaluation chip. The other configuration is the same as that of the second embodiment. The formation of the node IN1 connected to the external terminal makes it possible to give a desired voltage to the node IN1 in a write operation of a break/short mode. As a result, more detailed evaluation can be executed in the break/short mode.

In this embodiment, the same effects as those in the above-described first and second embodiments are also obtainable.

Figure 11:
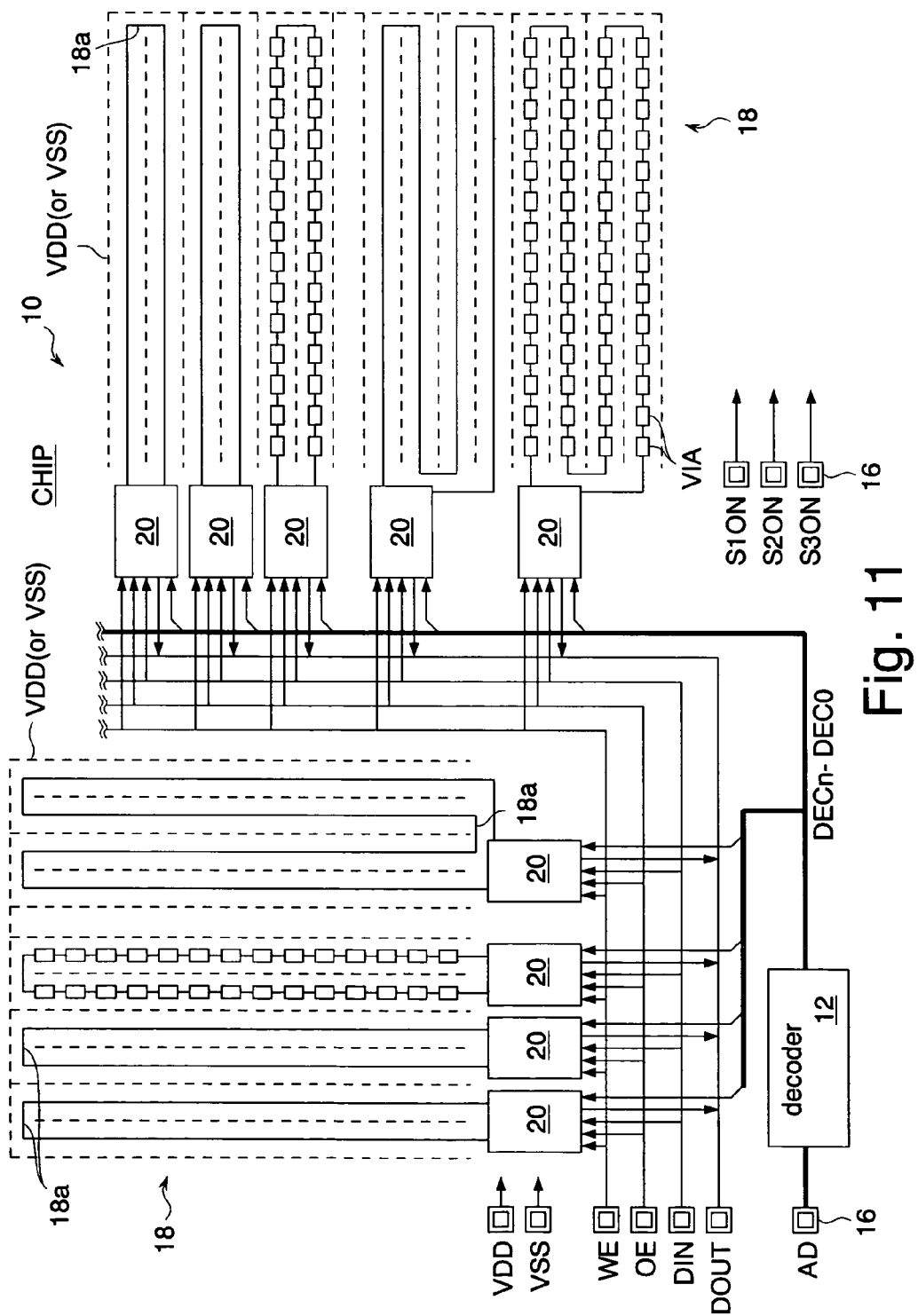
FIG. 11 is a block diagram showing a fourth embodiment of the present invention.

FIG. 11 shows a fourth embodiment of the semiconductor integrated circuit of the present invention. The same reference numerals and symbols are used to designate the same elements as the elements described in the first embodiment, and detailed explanation thereof will be omitted.

An evaluation chip CHIP of this embodiment has external terminals directly receiving switch control signals S1ON, S2ON, S3ON. Therefore, neither the mode terminals MODE0, MODE1 nor the switch control circuit 14 of the first embodiment is formed. The other configuration is the same as that of the first embodiment. Switch circuits SW1, SW2, SW3 of each control circuit 20 turns on or off according to the switch control signals S1ON, S2ON, S3ON supplied via the external terminals. The switch control signals S1ON, S2ON, S3ON are supplied from an LSI tester or the like connected to the evaluation chip CHIP. Then, the above-described evaluation shown in FIG. 6 is executed similarly to the first embodiment. In this embodiment, the same effects as those of the above-described first and second embodiments are also obtainable.

In the examples of the above-described first to fourth embodiments, the wiring evaluation circuits are formed inside the evaluation chip CHIP in order to evaluate the semiconductor fabrication process. The present invention is not limited to such embodiments. For example, the wiring evaluation circuits may be formed in scribe areas that are formed in connection portions of a plurality of product chips formed on a semiconductor wafer. In other words, the wiring evaluation circuits may be formed inside a scribe TEG (Test Element Group). In this case, fluctuation in process conditions can be also confirmed during mass production of the product chips.

In the examples in the above-described first to fourth embodiments, each of the evaluation wirings 18 is constituted of a metal wiring line that is formed by using at least one of the first to fourth metal wiring layers M1 to M4 and a break or a short of the metal wiring line is evaluated. The present invention is not limited to such embodiments. For example, the evaluation wiring may be constituted of a polysilicon wiring line that is formed by using a polysilicon layer and a break or a short of the metal wiring line of the polysilicon wiring line may be evaluated.

In the examples in the above-described first to fourth embodiments, one of the control circuits 20 is selected in sequence based on the decoded signal DEC, and the corresponding evaluation wiring 18 is evaluated in sequence. The present invention is not limited to such embodiments. For example, the pads 16 and the signal lines for control signals such as the write enable signal and the output enable signal may be formed for each of the control circuits 20 so as to allow the plural control circuits 20 to operate simultaneously. In this case, the evaluation time can be shortened.

The invention is not limited to the above embodiments and various modifications may be made without departing from the spirit and scope of the invention. Any improvement may be made in part or all of the components.

What is claimed is:

1. A semiconductor integrated circuit comprising:
an evaluation wiring;
an input circuit connected to one end of said evaluation wiring and writing a predetermined logic level to the one end;
a latch circuit connected to an other end of said evaluation wiring and latching a logic level of the other end;
a first switch circuit connecting an output of said input circuit to an input of said latch circuit;
a second switch circuit connecting the output of said input circuit to the one end of said evaluation wiring;
a third switch circuit connecting the other end of said evaluation wiring to an input of said latch circuit; and
an output circuit reading the logic level latched by said latch circuit.

2. The semiconductor integrated circuit according to claim 1, further comprising
a switch control circuit outputting a first switch control signal, a second switch control signal, and a third switch control signal that control ON/OFF of said first switch circuit, said second switch circuit, and said third switch circuit, respectively.

3. The semiconductor integrated circuit according to claim 2, wherein
said switch control circuit turns on said first switch circuit and turns off said second and third switch circuits during a bypass mode for detecting failure of a circuit except said evaluation wiring.

4. The semiconductor integrated circuit according to claim 2, wherein
said switch control circuit turns off said first switch circuit and turns on said second and third switch circuits during a wiring evaluation mode for detecting failure of said evaluation wiring.

5. The semiconductor integrated circuit according to claim 2, wherein:
said third switch circuit is a bi-directional switch allowing bi-directional transmission of a logic level; and during a break/short mode for discriminating which one of break failure and short failure exists in said evaluation wiring,
said switch control circuit turns on said first and third switch circuits and turns on or off said second switch circuit while said input circuit is executing a write operation for writing the predetermined logic level to said evaluation wiring, and
said switch control circuit turns off said first switch circuit and turns on said second and third switch circuits while said output circuit is executing a read operation for reading the logic level latched by said latch circuit.

6. The semiconductor integrated circuit according to claim 1, wherein
said evaluation wiring is constituted of wire pieces formed by using a plurality of wiring layers, respectively, and vias connecting the wire pieces of the different wiring layers to each other.

7. The semiconductor integrated circuit according to claim 1, further comprising
a power supply line wired along said evaluation wiring.

8. The semiconductor integrated circuit according to claim 1, wherein
at least one of said first to third switch circuits is a MOS transistor whose input and output are connected to a source and a drain, respectively, and which turns on or off according to a gate voltage.

9. The semiconductor integrated circuit according to claim 8, wherein
at least one of said first to third switch circuits is a CMOS transmission gate.

10. The semiconductor integrated circuit according to claim 1, wherein
at least one of said first to third switch circuits is a gated buffer that turns on or off according to a control signal.

11. The semiconductor integrated circuit according to claim 10, further comprising
a fourth switch circuit connecting the output of said input circuit to the other end of said evaluation wiring, wherein
said third switch circuit is the gated buffer.

12. The semiconductor integrated circuit according to claim 1, wherein:
said input circuit and said latch circuit are constituted as a monitor circuit having a first and a second NAND gates;
the first NAND gate has one input receiving a signal with a logic equal to a logic of write data, the other input connected to an output of the second NAND gate, and an output connected to said first and second switch circuits; and
the second NAND gate has one input receiving a signal with a logic inverse to a logic of the write data, the other input connected to said first and third switches, and an output connected to said output circuit.

13. The semiconductor integrated circuit according to claim 1, further comprising
external terminals receiving a first switch control signal, a second switch control signal, and a third switch control signal that control ON/OFF of said first switch circuit, said second switch circuit, and said third switch circuit, respectively.

14. An evaluation method of wiring in a semiconductor integrated circuit that comprises:
an evaluation wiring;

an input circuit connected to one end of said evaluation wiring and writing a predetermined logic level to the one end;

a latch circuit connected to the other end of said evaluation wiring and latching a logic level of the other end;

a first switch circuit connecting an output of said input circuit to an input of said latch circuit;

a second switch circuit connecting the output of said input circuit to the one end of said evaluation wiring;

a third switch circuit connecting the other end of said evaluation wiring to the input of said latch circuit; and an output circuit reading the logic level latched by said latch circuit, said evaluation method including the steps of turning on said first switch circuit and turning off said second and third switch circuits, writing the predetermined logic level (first expected value) to said evaluation wiring by said input circuit, judging that a circuit except said evaluation wiring have failure when the logic level read by said output circuit is different from the expected value, and judging that the circuit except said evaluation wiring have no failure when the logic level read by said output circuit is equal to the first expected value.

15. The evaluation method of wiring in a semiconductor integrated circuit according to claim 14, wherein "logic 1" and "logic 0" are written in sequence as expected values;

the circuit except said evaluation wiring are judged to have failure when one of the logic levels read in sequence is different from one of the first expected values; and the circuit except said evaluation wiring are judged to have no failure when the logic levels read in sequence are both equal to the first expected values.

16. The evaluation method of wiring in a semiconductor integrated circuit according to claim 14, further comprising the steps of, after judging that the circuit except said evaluation wiring have no failure:

turning off said first switch circuit and turning on said second and third switch circuits;

writing a predetermined logic level (second expected value) to said evaluation wiring by said input circuit;

judging that said evaluation wiring has one of break failure and short failure when the logic level read by said output circuit is different from the second expected value; and judging that said evaluation wiring has no failure when the logic level read by said output circuit is equal to the second expected value.

17. The evaluation method of wiring in a semiconductor integrated circuit according to claim 16, wherein: "logic 1" and "logic 0" are written as expected values in sequence;

said evaluation wiring is judged to have one of the break failure and the short failure when one of the logic levels read in sequence is different from one of the second expected values; and said evaluation wiring is judged to have no failure when the logic levels read in sequence are both equal to the second expected values.

18. The evaluation method of wiring in a semiconductor integrated circuit according to claim 16, further comprising the steps of, after judging that said evaluation wiring has one of the break failure and the short failure:

turning on said first and third switch circuits and turning on or off said second switch circuit;

writing the predetermined logic level (third expected value) to said evaluation wiring via said first and third switches by said input circuit;

turning off said first switch circuit and turning on said second and third switch circuits;

judging that said evaluation wiring has the short failure when the logic level read by said output circuit is different from the third expected value; and judging that said evaluation wiring has the break failure when the logic level read by said output circuit is equal to the third expected value.

19. The evaluation method of wiring in a semiconductor integrated circuit according to claim 18, wherein:

"logic 1" and "logic 0" are written as expected values in sequence;

said evaluation wiring is judged to have the short failure when one of the logic levels read in sequence is different from one of the third expected values; and said evaluation wiring is judged to have the break failure when the logic levels read in sequence are both equal to the third expected values.

* * * * *